(12) United States Patent
Leomant et al.

(10) Patent No.: US 11,581,369 B2
(45) Date of Patent: Feb. 14, 2023

(54) SEMICONDUCTOR SWITCH ELEMENT AND METHOD OF MANUFACTURING THE SAME

(71) Applicant: Infineon Technologies Austria AG, Villach (AT)

(72) Inventors: Sylvain Leomant, Poertschach am Woerthersee (AT); Gerhard Noebauer, Villach (AT); Thomas Oszinda, Villach (AT); Christian Gruber, Finkenstein (AT); Sergey Ananiev, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 148 days.

(21) Appl. No.: 17/117,576

(22) Filed: Dec. 10, 2020

(65) Prior Publication Data
US 2021/0183948 A1    Jun. 17, 2021

(30) Foreign Application Priority Data
Dec. 11, 2019   (EP) ..................................... 19215271

(51) Int. Cl.
*H01L 27/24* (2006.01)
*H01L 21/768* (2006.01)
*H01L 29/40* (2006.01)
*H01L 29/66* (2006.01)

(52) U.S. Cl.
CPC .... *H01L 27/2454* (2013.01); *H01L 21/76877* (2013.01); *H01L 29/407* (2013.01); *H01L 29/66666* (2013.01)

(58) Field of Classification Search
None
See application file for complete search history.

(56) References Cited

U.S. PATENT DOCUMENTS

2015/0357424 A1    12/2015 Kitao
2018/0090611 A1 *   3/2018 Togami ............... H01L 27/0207

FOREIGN PATENT DOCUMENTS

| JP | 2010087096 | * | 4/2010 | ............. H01L 29/78 |
| JP | 2010087096 | A | 4/2010 | |
| JP | 2010103208 | * | 5/2010 | ............. H01L 29/78 |
| JP | 2010103208 | A | 5/2010 | |

* cited by examiner

*Primary Examiner* — Hsien Ming Lee
(74) *Attorney, Agent, or Firm* — Murphy, Bilak & Homiller, PLLC

(57) ABSTRACT

The application relates to a semiconductor switch element, including: a first vertical transistor device formed in a substrate and having a source region formed on a first side of the substrate and a drain region formed on a second side of the substrate vertically opposite to the first side; a second vertical transistor device formed laterally aside the first vertical transistor device in the same substrate and having a source region formed on the first side of the substrate and a drain region formed on the second side of the substrate; a conductive element arranged on the second side of the substrate and electrically connecting the drain regions of the vertical transistor devices; and a trench extending vertically into the substrate at the second side of the substrate, wherein at least a part of the conductive element is arranged in the trench.

15 Claims, 15 Drawing Sheets

SEMICONDUCTOR SWITCH ELEMENT AND METHOD OF MANUFACTURING THE SAME

TECHNICAL FIELD

The present disclosure relates to a semiconductor switch element with vertical transistor devices.

BACKGROUND

In a vertical transistor device, a vertical channel region is formed in the body region of the device. The gate region is arranged laterally aside, it comprises a gate interlayer dielectric and a gate electrode. By applying a voltage to the gate electrode, the channel formation in the channel region can be controlled. The source and the drain region of the device can be arranged at opposite sides of the semiconductor substrate, for instance the source region at a front side and the drain region at a back side of the substrate.

SUMMARY

It is an object of the present disclosure to provide a semiconductor switch element with improved characteristics, as well as a method of manufacturing such a switch element.

This object is achieved by the switch element of claim 1, and moreover it is achieved by the method of claim 14. The switch element comprises a first vertical transistor device and a second vertical transistor device formed in the same substrate. The source regions of the transistor devices are arranged on a first side of the substrate, and the drain regions are formed vertically opposite on a second side of the substrate. The drain regions are connected with each other by a conductive element which is arranged on the second side of the substrate. Furthermore, a trench is formed on the second side of the substrate, and at least a part of the conductive element is arranged in this trench.

By forming the conductive element in the trench, the conductive material can be arranged closer to the active region of the respective device, e.g. closer to the drift region. In this way, the "effective thickness" of the substrate can be reduced in terms of the electric resistance, and a lower resistivity can for instance reduce conduction losses. The switch element with the transistor devices, which are arranged in this common drain or "back-to-back" configuration, can for instance be used in a battery management system, wherein the reduced conduction losses can allow for higher charging currents. Vice versa, when the same "effective thickness" would be realized without the trench structure by a homogeneous back side grinding, the remaining substrate thickness would be so small that an excessive wafer bow would result. The wafer bow, which can for instance result from the mismatch in the thermal expansion of the substrate and the metal and can depend on the substrate and metal thickness, could cause handling problems, e. g. in the subsequent backend processing.

Further embodiments and features are provided in this description and in the dependent claims. Therein, the individual features shall be disclosed independently of a specific claim category, the disclosure relates to apparatus and device aspects, but also to method and use aspects. If for instance a switch element manufactured in a specific way is described, this is also a disclosure of a respective manufacturing process, and vice versa. In general words, an approach of this application is to arrange the drain contact or metallization of a vertical transistor device in a trench.

Seen in a vertical cross-section, the trench is a recess which extends into the substrate to a bottom of the trench. Laterally, it is defined by the sidewalls of the trench. Perpendicularly to such a cross-section, the trench can for instance have an elongated shape, or it can have a hole-like shape, see in detail below. The conductive element can be formed of any conductive material, like for instance doped polysilicon. In particular, the conductive material can be a metal material, e. g. copper, in particular a copper-based alloy.

In general, the entire conductive element could be arranged in the trench, for instance in case of a single longitudinal trench connecting the transistor devices. Alternatively, only a part of the conductive element can be arranged in the trench, other parts of the conductive element being arranged in other trenches and/or on the surface of the substrate, namely on the second side thereof. A conductive element extending partially on the surface of the substrate can be combined with longitudinal trenches or hole-shaped trenches. In case of hole-shaped trenches, the part of the conductive element arranged on the surface can connect the transistor devices laterally.

The source and the drain region of a respective transistor device can be of a first conductivity type, its body region being of a second conductivity type opposite to the first conductivity type. In the illustrated embodiments, the first conductivity type is n-type and the second conductivity type is p-type. The vertical transistor devices are formed in the same substrate, which can enable a small footprint and low profile package thus (particularly advantageous in e. g. handheld applications). The substrate can for instance be formed by the initial wafer material, for example silicon wafer material, e. g. together with one or more epitaxial layers. In the latter, the source and the body regions can be formed. In general words, the substrate is formed of the semiconducting layer(s) of the switch element, which can be or is/are doped. Each transistor device can comprise a plurality of transistor cells, which have a common source contact, a common drain contact and a common gate contact. In contrast thereto, the first and the second transistor device can respectively have an individual gate contact. In other words, the first and the second transistor device can be switched independently of each other.

The "vertical" direction lies perpendicular to a surface of the substrate, for instance a surface of the silicon wafer material and/or a surface of an epitaxial layer. The first and the second side of the substrate lie opposite to each other with respect to the vertical direction. The lateral directions lie perpendicular to the vertical direction, the die area is for instance taken laterally. The trench formed at the second side of the substrate extends vertically into the substrate.

In an embodiment, the trench has a vertical depth of 15 µm at minimum, in particular 20 µm at minimum. Possible upper limits of the trench depth can for instance be 40 µm at maximum, in particular 35 µm at maximum. In this range, a trade-off between for instance a reduction of the remaining effective thickness and an acceptable mechanical stress in the substrate can be achieved.

Between the channel and the drain region, a respective transistor device can comprise a drift region. The drift region and the drain region both are of the first conductivity type, for instance n-type, wherein the doping concentration is lower in the drift region. By arranging the conductive element or material in the trench, it can be brought rather close to the drift region, which lowers the resistivity. In an embodiment, the vertical distance between a bottom of the trench and the drift region is 30 µm at maximum, further upper limits being 25 µm, 20 µm or 15 µm at maximum. Possible lower limits of the vertical distance can for instance be 5 µm or 10 µm.

In an embodiment, the trench has a lateral width of 100 µm at maximum, further upper limits being for instance 80 µm, 60 µm, 50 µm or 40 µm at maximum. Possible lower limits of the lateral width can for instance be 15 µm or 20 µm at minimum. The width is taken at the vertically outer end of the trench, opposite to the bottom of the trench. In particular, the width can be taken in a second lateral direction perpendicular to a first lateral direction (in the first lateral direction, the transistor devices are arranged laterally aside each other, see below).

In general, the trench can be filled completely with the conductive material of the conductive element. In an alternative embodiment, the conductive material fills only a portion of the trench, wherein no conductive material is arranged in another portion of the trench. The conductive material can cover the bottom and/or sidewalls of the trench, leaving, in a cross-sectional view, a central portion without conductive material. The partial filling of the trench can for instance reduce the mechanical stress in the substrate, as the conductive material, in particular metal, can have more free space to relax.

In an embodiment, the other portion of the trench, which is not filled with conductive material, is filled with a polymeric material. Together, the conductive material and the polymeric material can fill up the trench completely. With the polymeric material filler, a void inside the trench can be avoided, which can for instance be advantageous in view of later environmental stress (like humidity and the like). The polymeric material can be an epoxy material, for example an epoxy resin.

Basically, the transistor devices could be connected by a single longitudinal trench. In an embodiment, however, a plurality of trenches are formed on the second side of the substrate, wherein a part of the conductive element is arranged in each of the trenches. Compared to the single trench solution, this can for instance enable a more even distribution of the mechanical stress in the substrate.

In an embodiment, at least some of the trenches are arranged laterally aside each other in a second lateral direction. In a first lateral direction, the transistor devices lie laterally aside each other, wherein the second lateral direction lies perpendicular thereto. As can be seen from the exemplary embodiments, the trenches arranged aside each other can be longitudinal trenches (see FIG. 1A) or hole-shaped trenches (see FIG. 4).

In an embodiment, a plurality of hole-shaped trenches are formed on the second side of the substrate. In a respective hole-shaped trench, the conductive material can for instance have columnar shape, in particular a hollow columnar shape in case of the partial filling described above. Providing hole-shaped trenches can also allow for an even distribution of the wafer bow in both, the first and the second lateral direction.

In an embodiment, a first subset of the hole-shaped trenches is arranged vertically aligned with the first transistor device, and a second subset of the hole-shaped trenches is arranged vertically aligned with the second transistor device. Via the first subset, the current can be collected from the drain region of the first transistor device, and via the second subset, the current can be collected from the drain region of the second transistor device. In other words, the first subset of trenches reduces the effective substrate thickness at the first transistor device, and the second subset of trenches reduces the effective thickness at the second transistor device.

The hole-shaped trenches can be arranged in rows. In each row, some of the trenches can be aligned, in particular on a straight line respectively. The rows are arranged laterally aside each other, e. g. basically parallel to each other. In an embodiment, the hole-shaped trenches of neighbouring rows are arranged with an offset to each other. In other words, along the row direction, the hole-shaped trenches are arranged alternately in one of the two neighbouring rows respectively. The mechanical stress in the substrate can depend on the distance between neighbouring trenches, namely increase with decreasing distance. Provided that the distance between neighbouring trenches remains unchanged, the offset can allow for a denser packing (e. g. up to 15%) of the hole-shaped trenches and a lower resistivity without increasing the mechanical stress in the substrate. The offset trenches can for instance be arranged in a hexagonal pattern, e. g. a honeycomb pattern.

In a horizontal cross-section, a hole-shaped trench can basically have any cross-section, for instance a polygonal cross-section, e. g. rectangular (possibly with rounded edges). In an embodiment, a respective hole-shaped trench has a circular cross-section. This can allow for a dense packing of the trenches and/or a reduction of the mechanical stress in the substrate due to the round shape.

In an embodiment, the trench is a longitudinal trench and extends laterally from the first to the second transistor device. A middle section of the longitudinal trench can be arranged laterally between the transistor devices, and the end sections of the trench can lie vertically aligned with one of the transistor devices respectively. When a plurality of longitudinal trenches are provided, these can be arranged laterally aside each other in the first lateral direction (see above). In particular, the trenches can extend parallelly to each other. Basically, longitudinal and hole-shaped trenches can be combined in the same switch element. Alternatively, the switch element can be provided either with hole-shaped trenches or with one or more longitudinal trenches.

The application also relates to a switch device which comprises the semiconductor switch element disclosed here and a board, on which the semiconductor switch element is mounted. The board can be a circuit board, for instance a printed circuit board. The switch element can be mounted on the board by flip chip bonding, namely with the first side of the substrate facing the board. On this side of the substrate, metal pads forming source contacts and/or gate contacts can be provided, and these pads can be soldered directly to the board. In case of the trench filled partly with a polymeric material (see above), this polymeric material can cover the second side of the substrate entirely, providing a certain protection.

The invention also relates to a method of manufacturing a switch element disclosed here, comprising the steps:
 i) forming the transistor devices;
 ii) etching the trench or trenches into the substrate, namely on the second side thereof;
 iii) filling the trench or trenches at least partly with the conductive material.

Regarding further manufacturing details, reference is made to the description above.

The invention also relates to a use or method of using a semiconductor switch element, or respective switch device, in a battery management system. A battery management system can for instance ensure that a rechargeable battery remains in safe operating area while avoiding over-current and/or over-voltage stresses. In the battery management system, the switch element or device of this disclosure can be used for connecting and disconnecting the battery to or from a charge or discharge path. With the bidirectional switch element or switch device of the present application, it is possible to allow or block the current flow in both directions.

In general words, an approach of this application is to arrange the drain contact or metallization of a vertical transistor device in a trench. This can also be advantageous independently of connecting two devices formed in the same substrate, namely reduce the drain contact resistivity while maintaining at least some structural integrity of the substrate (e.g. advantageous in view of the wafer bow, see above). It shall also be disclosed: A semiconductor transistor device formed in a substrate, having a source region formed on a first side of the substrate, a drain region formed on a second side of the substrate, vertically opposite to the first side, and a drain metallization arranged on the second side of the substrate, electrically contacting the drain region, wherein a trench extending vertically into the substrate is formed on the second side of the substrate, and wherein at least a part of the drain metallization is arranged in the trench. Regarding possible details, reference is made to the description and the claims.

BRIEF DESCRIPTION OF THE DRAWINGS

Below, the switch element and the manufacturing of the same are explained in further detail by means of exemplary embodiments. Therein, the individual features can also be relevant for this application in a different combination.

DETAILED DESCRIPTION

Figure 1A:
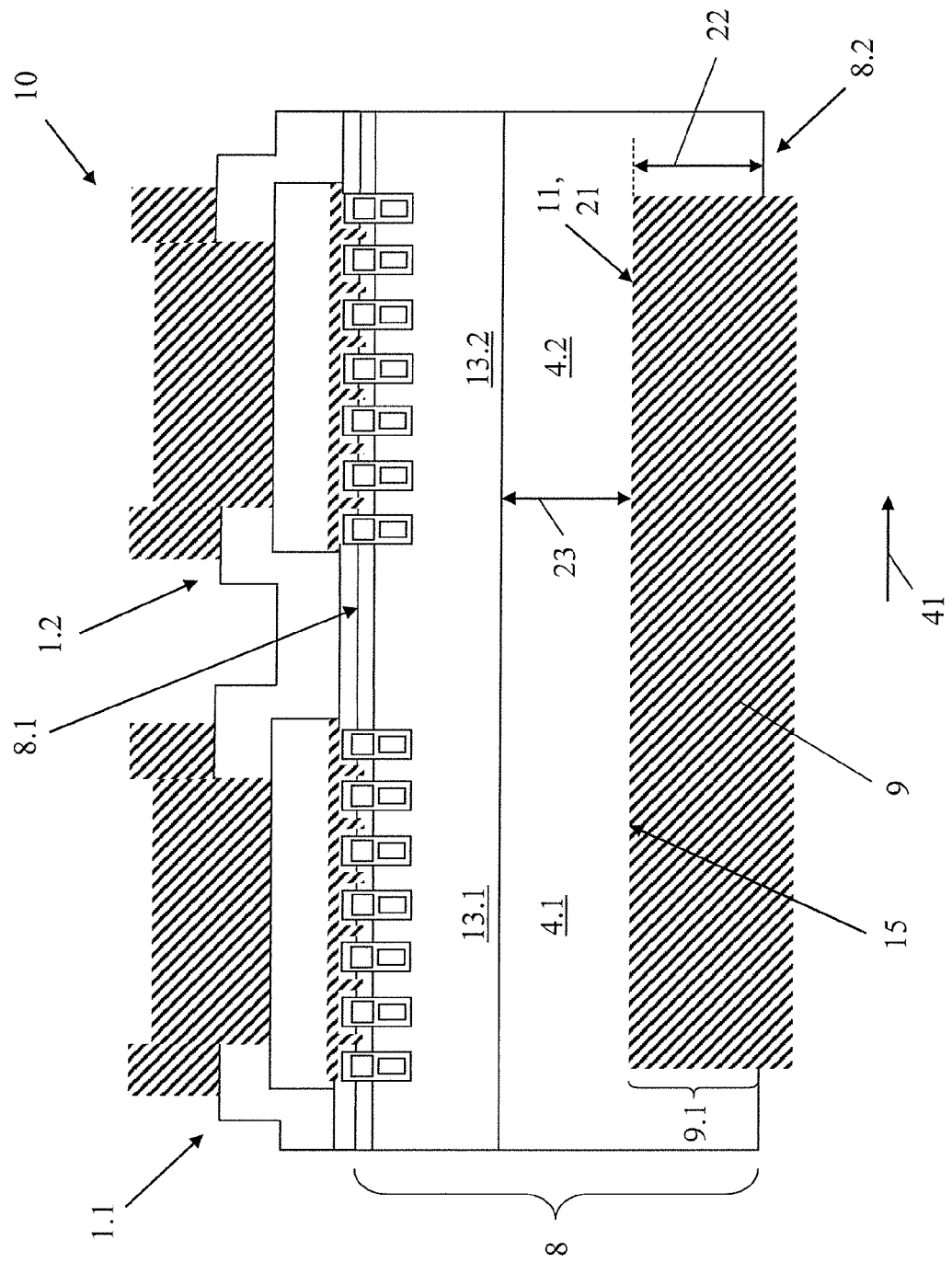
FIG. 1A shows a semiconductor switch element with a first and a second transistor device formed in the same substrate.

FIG. 1A shows a semiconductor switch element 10 comprising a first vertical transistor device 1.1 and a second vertical transistor device 1.2. The transistor devices 1.1, 1.2 are formed in the same substrate 8. On a first side 8.1 of the substrate 8, a source region 2.1 of the first transistor device 1.1 and a source region 2.2 of the second transistor device 1.2 are arranged. Vertically opposite, on a second side 8.2 of the substrate 8, a drain region 4.1 of the first transistor device 1.1 and a drain region 4.2 of the second transistor device 1.2 are arranged.

On the second side 8.2 of the substrate 8, a conductive element 9 is formed. It electrically connects the drain region 4.1 of the first transistor device 1.1 and the drain region 4.2 of the second transistor device 1.2. A trench 11 extends vertically into the substrate 8, and a part 9.1 of the conductive element 9 is arranged in the trench 11. Likewise, a vertical distance 23 between the conductive element 9 at a bottom 15 of the trench 11 and a respective drift region 13.1, 13.2 of the respective transistor device 1.1, 1.2 can be reduced (e. g. to around 10 µm). In consequence, the electrical resistivity is reduced, see the description above in detail.

Figure 1B:
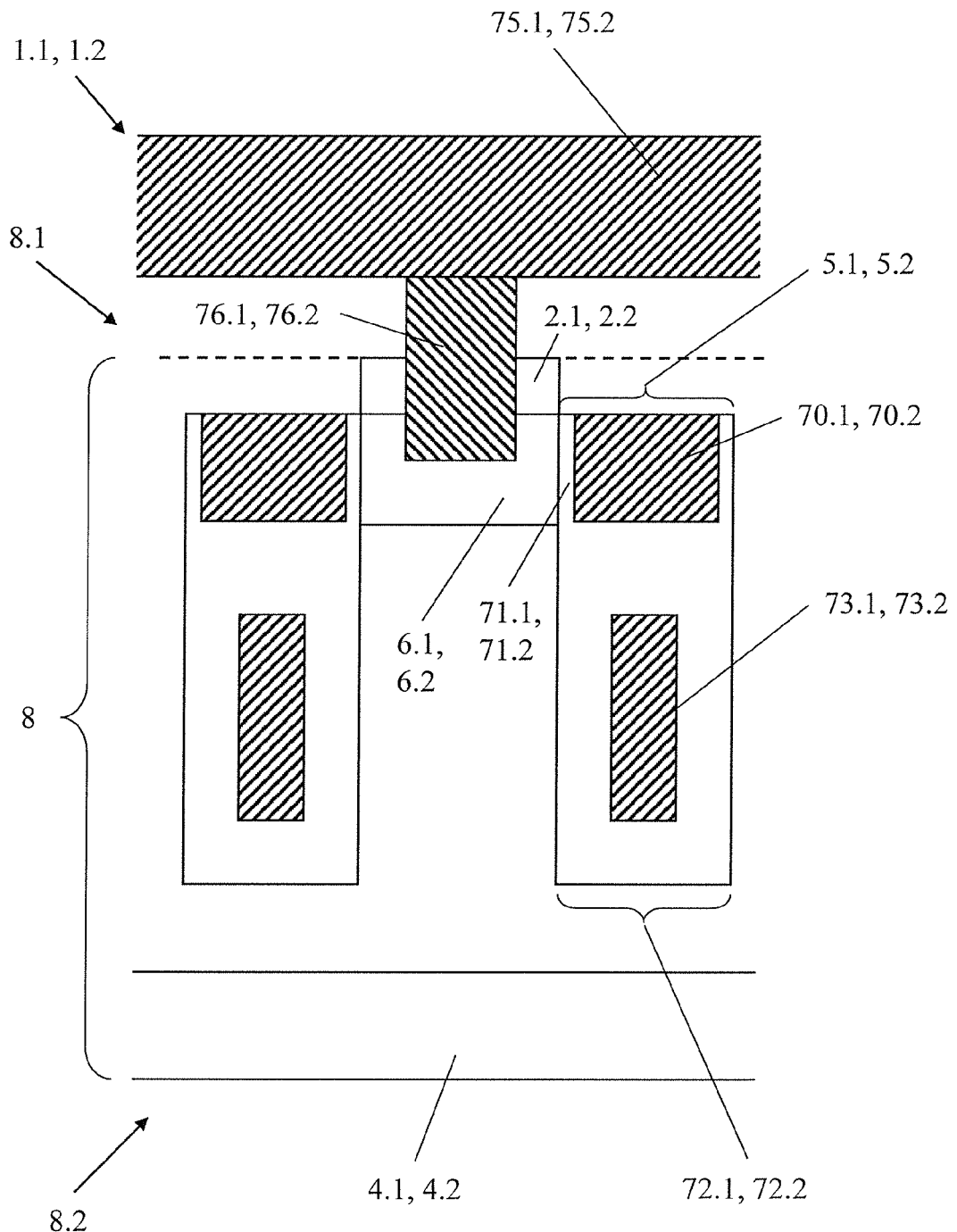
FIG. 1B shows a detailed view of a transistor device of the switch element of FIG. 1A.

FIG. 1B shows an enlarged view of a transistor cell. The first and the second transistor 1.1, 1.2 have an identical layout, the following description applies for both of them. Vertically between the source region 2.1, 2.2 and the drain region 4.1, 4.2, the body region 6.1, 6.2 is arranged. Laterally aside the body region 6.1, 6.2, a gate region 5.1, 5.2 is formed, it comprises a gate electrode 70.1, 70.2 and a gate dielectric 71.1, 71.2. By applying a voltage to the gate electrode 70.1, 70.2, a channel formation in the body region 6.1, 6.2 can be controlled.

In this embodiment, the gate region 5.1, 5.2 is arranged in a gate trench 72.1, 72.2. Therein, a field plate 73.1, 73.2 is formed in the gate trench 72.1, 72.2 below the gate electrode 70.1, 70.2, electrically isolated therefrom. In the cross-section shown here, the electrical contact of the gate electrode 70.1, 70.2 on the first side 8.1 of the substrate 8 is not visible (it is arranged in front of or behind the drawing plane). The source region 2.1, 2.2 and the body region 6.1, 6.2 are shorted, they can be contacted via a contact pad 75.1, 75.2 formed on the first side 8.1 of the substrate 8. A contact plug 76.1, 76.2 connects the contact pad 75.1, 75.2 to the source and body region 2.1, 2.2, 6.1, 6.2.

Figure 2A:
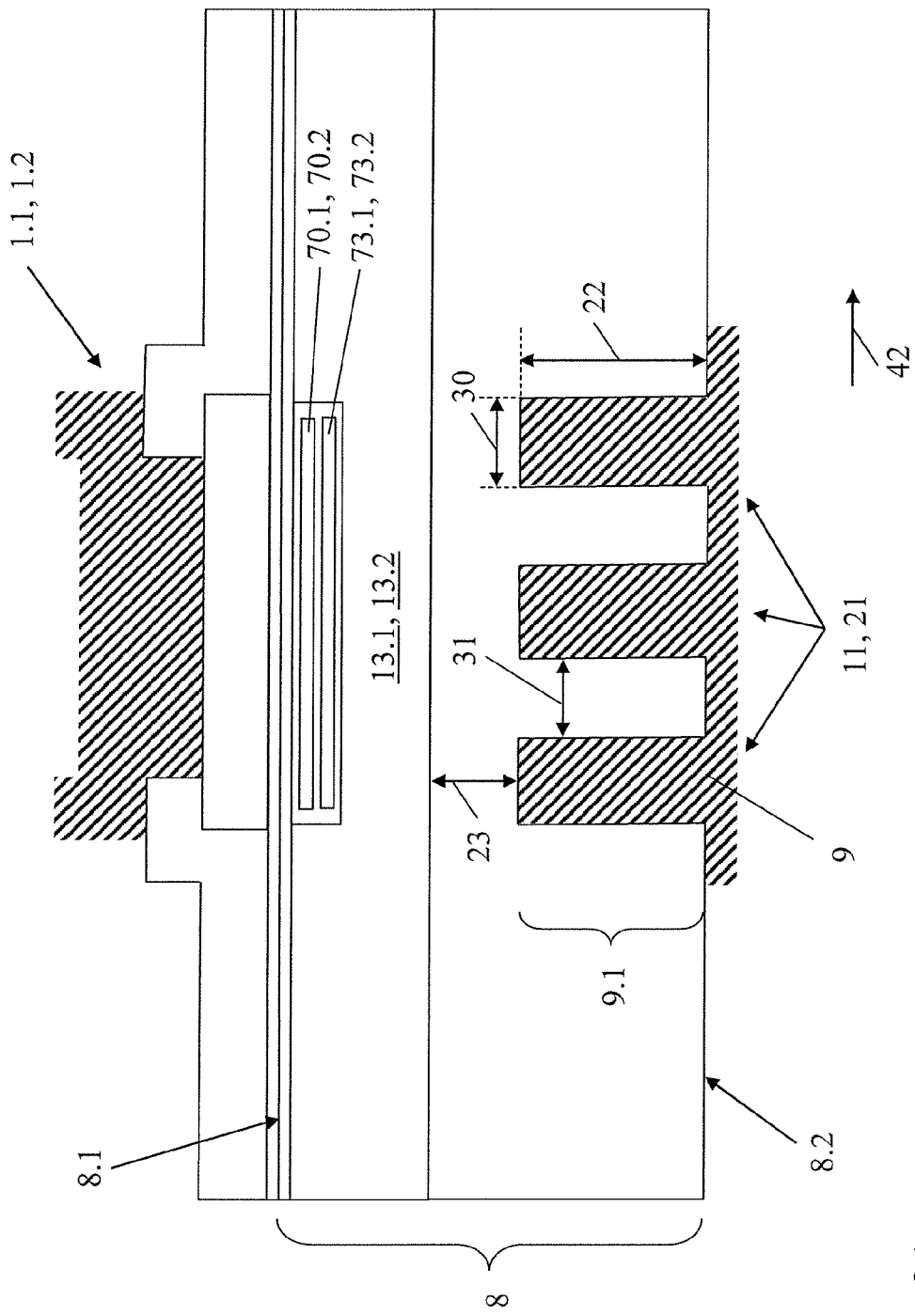
FIG. 2A illustrates the switch element of FIG. 1A in a cross-sectional view perpendicular to the sectional plane of FIG. 1A.

FIG. 2A shows the switch element 10 of FIG. 1A in another sectional plane, perpendicular to the sectional plane of FIG. 1A. Comparing the different views of FIGS. 1A and 2A, it can be seen that three trenches 11 are formed in the substrate 8. The trenches 11 are longitudinal trenches 21 which extend in a first vertical direction 41 from the first transistor device 1.1 to the second transistor device 1.2 (FIG. 1A). In a second lateral direction 42, which lies perpendicular to the first vertical direction 41, the trenches 11, 21 are arranged laterally aside each other (FIG. 2A).

By reducing the vertical distance 23 to the drift region 13.1, 13.2, the resistivity and switching losses, thus, can be reduced. On the other hand, as can be seen from FIG. 2A, the silicon material remains between the trenches 11, 21. Consequently, a wafer bow resulting from the mismatch in the thermal expansion of silicon and metal is lower compared to a solution obtained by grinding the entire second side 8.2 down to the vertical distance 23.

In the second lateral direction 42, the trenches 11, 21 respectively have a lateral width 30 of around 30 µm. A lateral distance 31 in between the trenches 11, 21 is around 30 µm in this example. Vertically, the trenches 11, 21 have a depth 22 of around 35 µm.

Figure 2B:
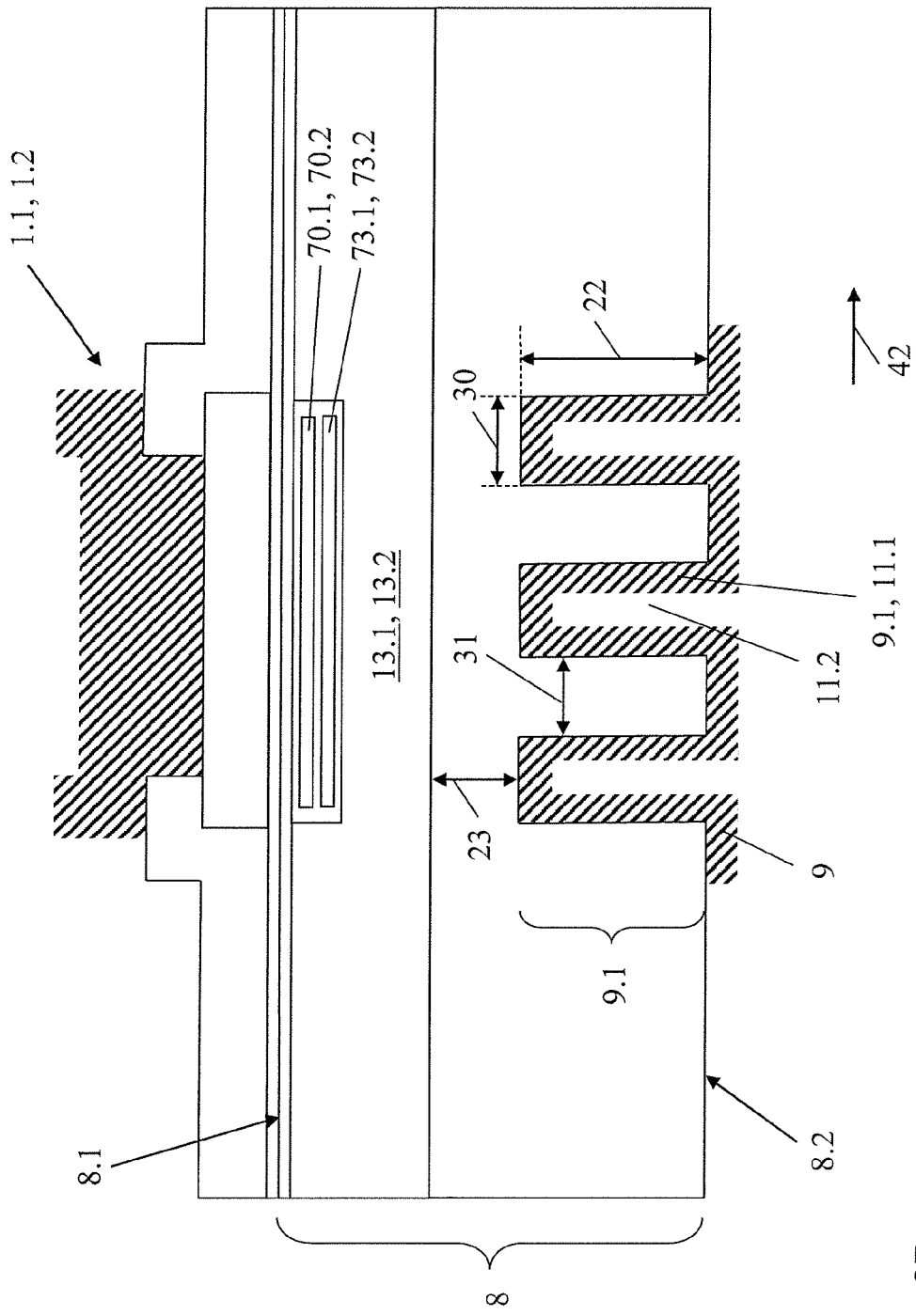
FIG. 2B illustrates an alternative switch element with the trenches filled only partly.

The embodiment of FIG. 2B differs from FIG. 2A in that the conductive material of the conductive element 9 fills only a respective portion 11.1 of a respective trench 11. In another portion 11.2 of the respective trench 11, no conductive material is arranged. Likewise, more space to relax is left for the conductive material, e. g. metal, which can reduce the mechanical stress in the substrate 8.

Figure 3:
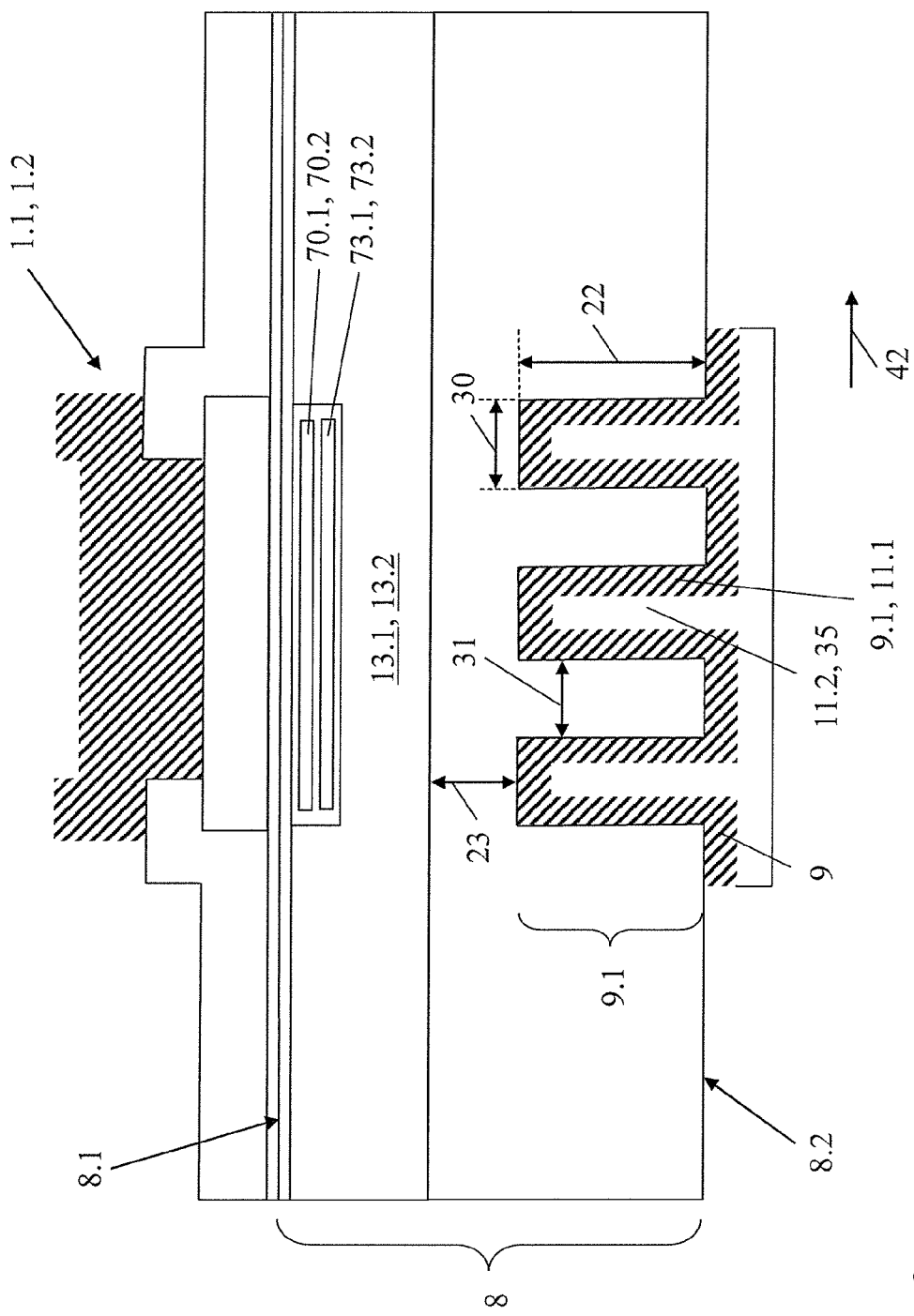
FIG. 3 illustrates a further alternative switch element with the trenches filled additionally with a polymeric material.

The embodiment of FIG. 3 differs from FIG. 2B in that the other portion 11.2 of the respective trench 11 is filled up with a polymeric material 35. The polymeric material 35 can for instance be an epoxy resin, it can cover the second side 8.2 of the substrate 8 partly or entirely. It can provide a protection against humidity and the like.

Figure 4:
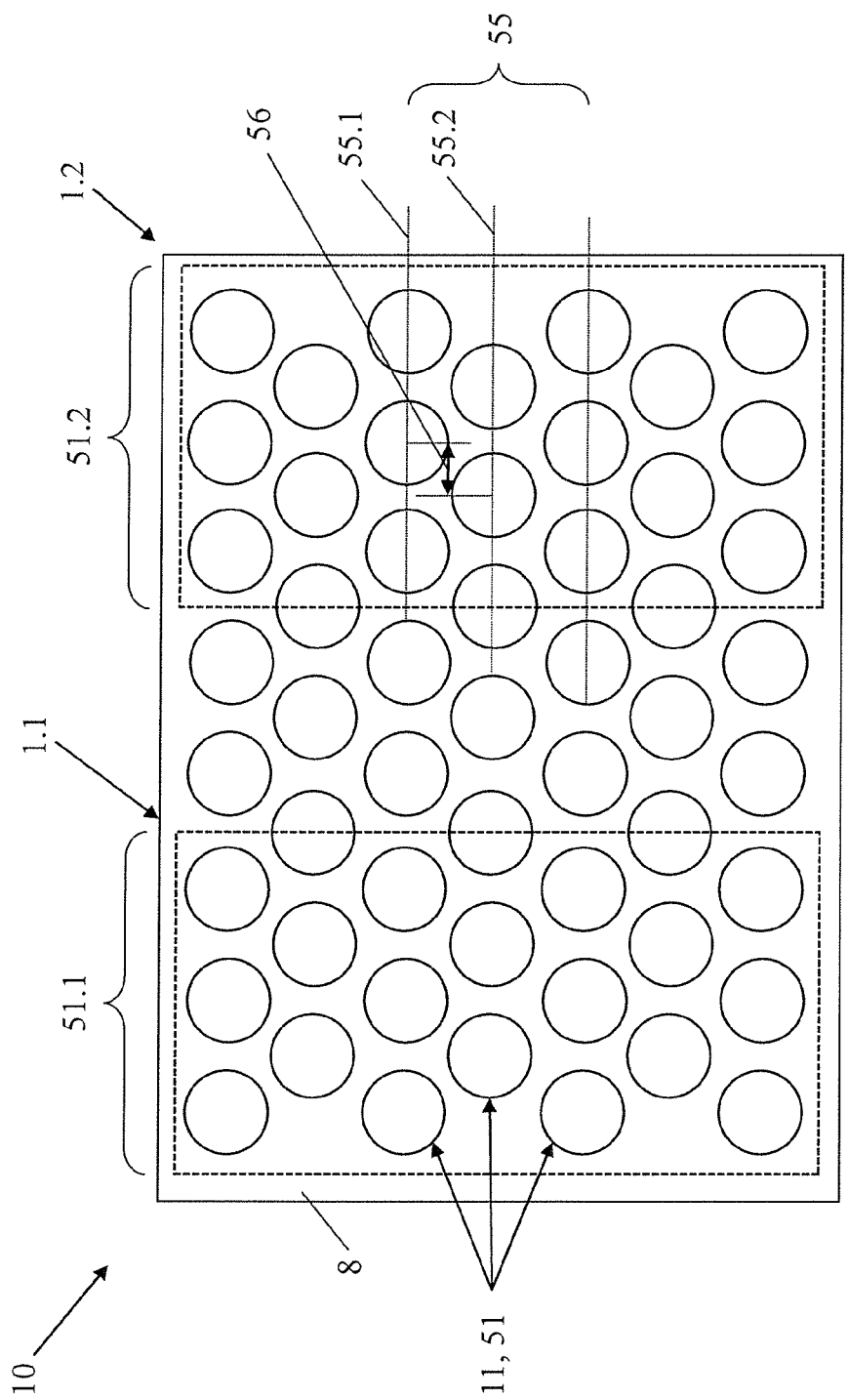
FIG. 4 shows a schematic top view of a switch element and illustrates hole-shaped trenches arranged with an offset.

FIG. 4 shows a schematic top view of a switch element 10 comprising a first transistor device 1.1 and a second transistor device 1.2 formed in the same substrate 8. As described above, the first and the second transistor device 1.1, 1.2 are connected by a conductive element (not shown in FIG. 4). Partly, the conductive element is arranged in trenches 11, namely hole-shaped trenches 51 in this embodiment. In a vertical cross-section, the hole-shaped trenches 51 can have the same design as the trenches 11 shown in FIGS. 2A, 2B and 3. They can be filled entirely or partly with the conductive material, optionally in combination with a polymeric material.

As can be seen from FIG. 4, the hole-shaped trenches 51.1, 51.2 for both transistor devices 1.1, 1.2 are arranged in rows 55. Therein, the hole-shaped trenches 51 of neighbouring rows 55.1, 55.2 are arranged with an offset 56 to each other. Likewise, the packing density of the hole-shaped trenches 51 can be increased without reducing the minimum distance between neighbouring hole-shaped trenches 51.

Figure 5:
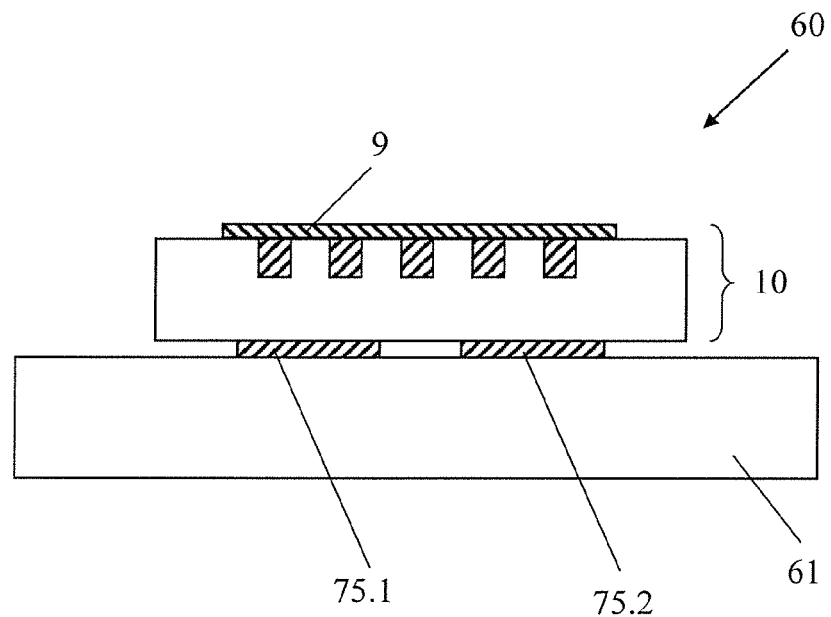
FIG. 5 shows a vertical cross-sectional view of a switch device with a switch element mounted on a board.

FIG. 5 shows a switch device 60 comprising a switch element 10 as described above and a board 61. The switch element 10 is mounted on the board 61 by flip chip bonding, the first side 8.1 of the substrate 8 faces the board 61. The electrical contact to the board 61 is formed via the contact pads 75.1, 75.2, these are soldered directly to the board 61 (not shown in detail).

Figure 6A:
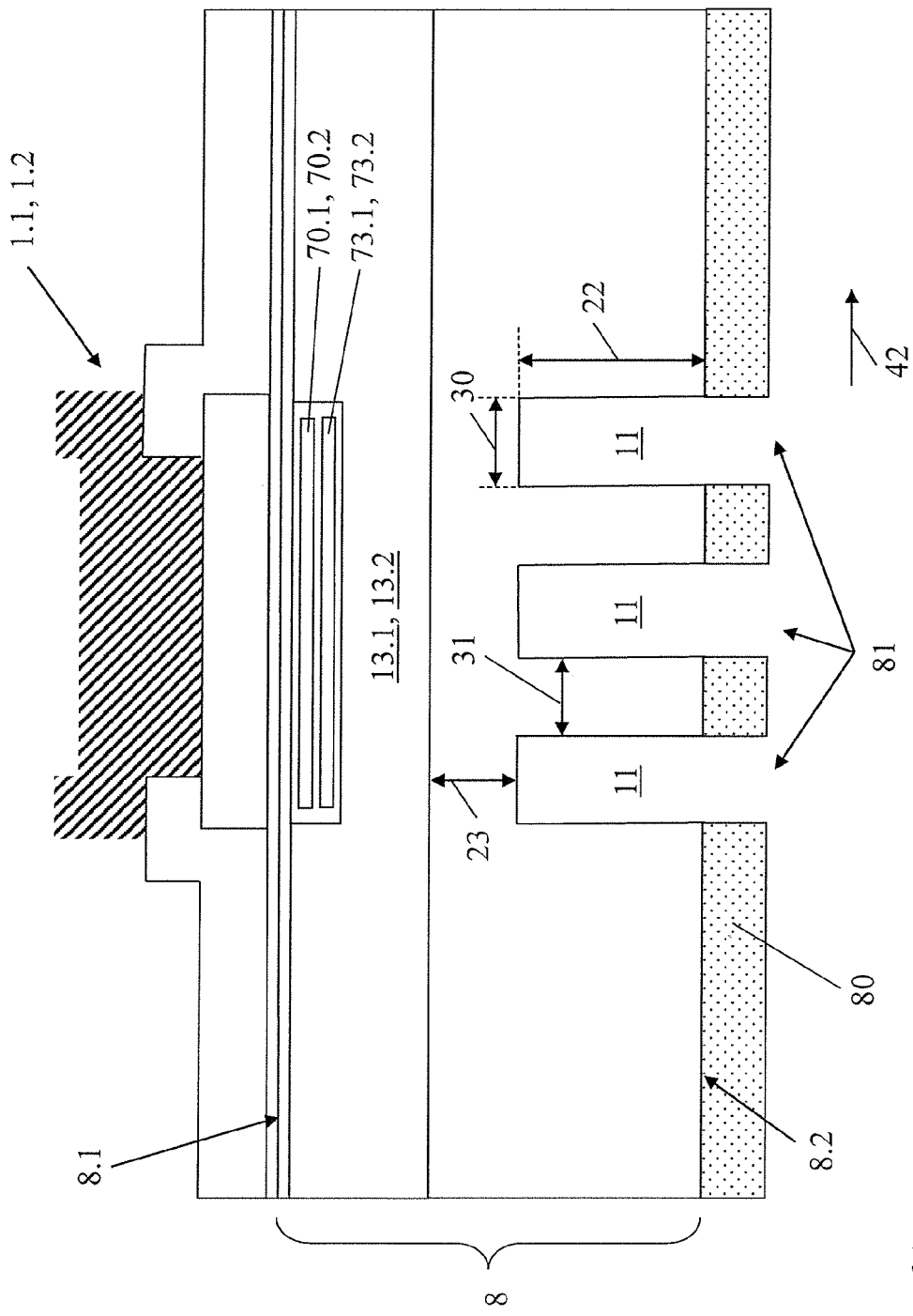
FIGS. 6A-6D illustrate the manufacturing of the switch element of FIG. 2B with trenches formed in the substrate.
Figure 6B:
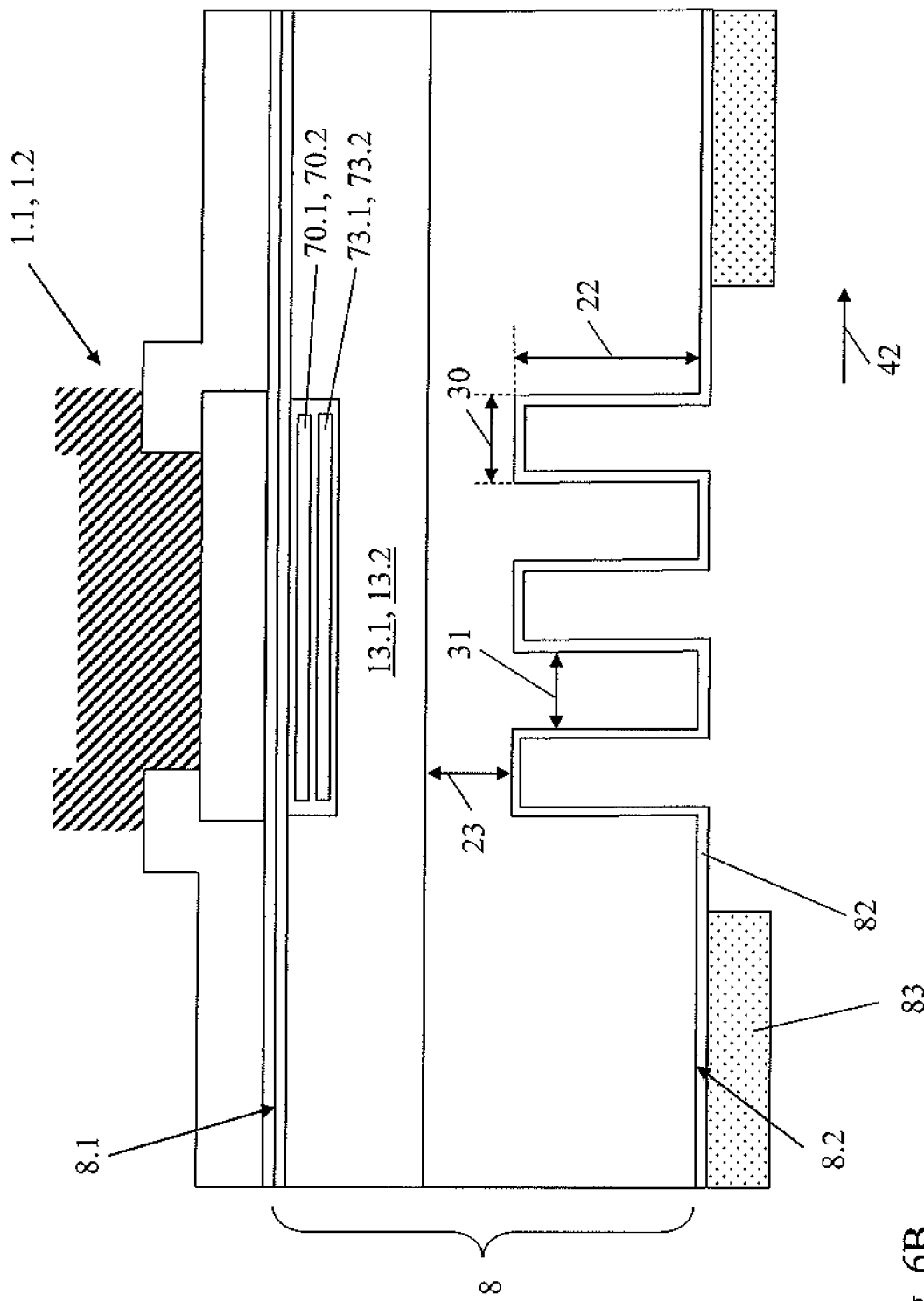
Figure 6C:
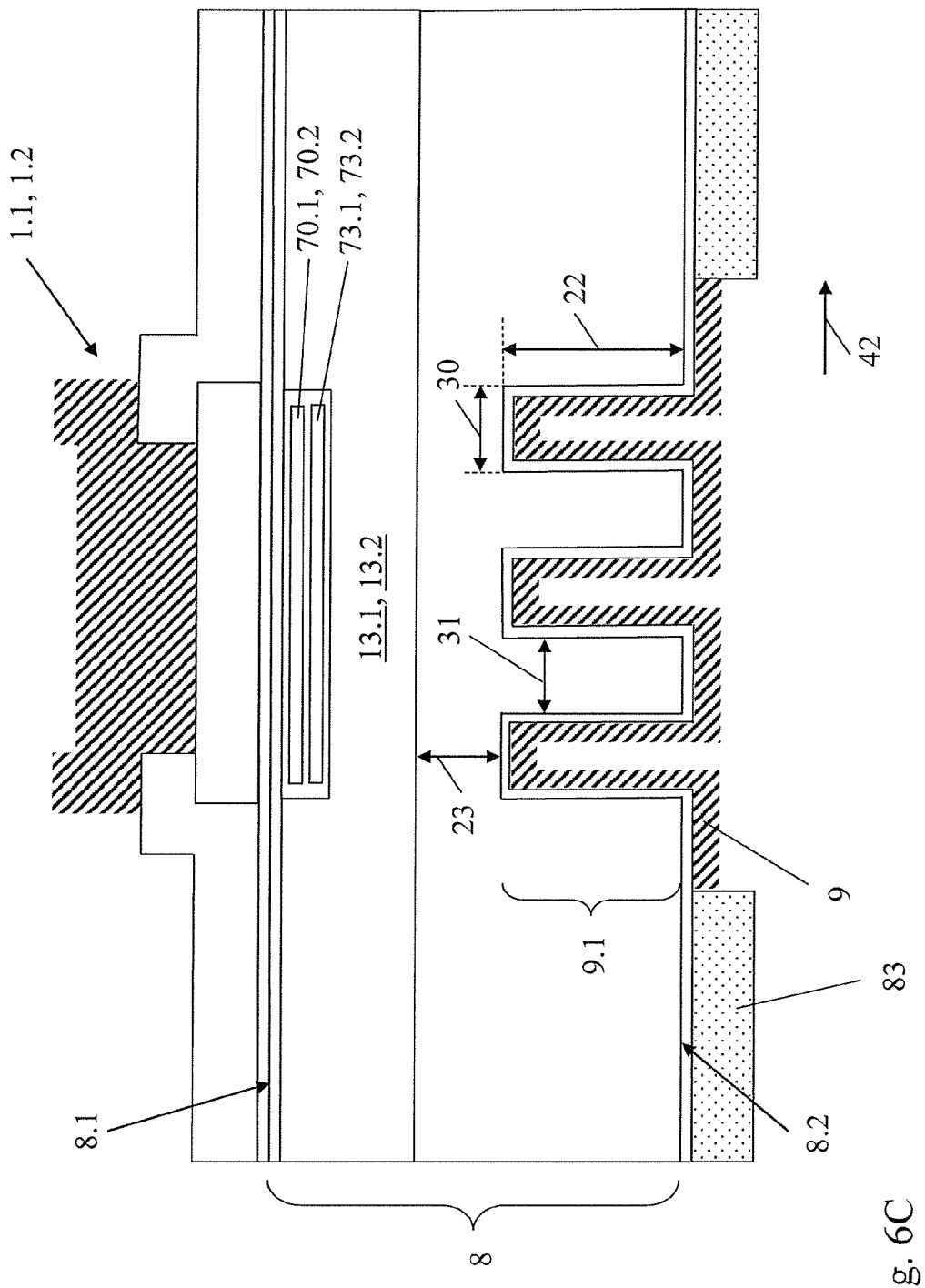
Figure 6D:
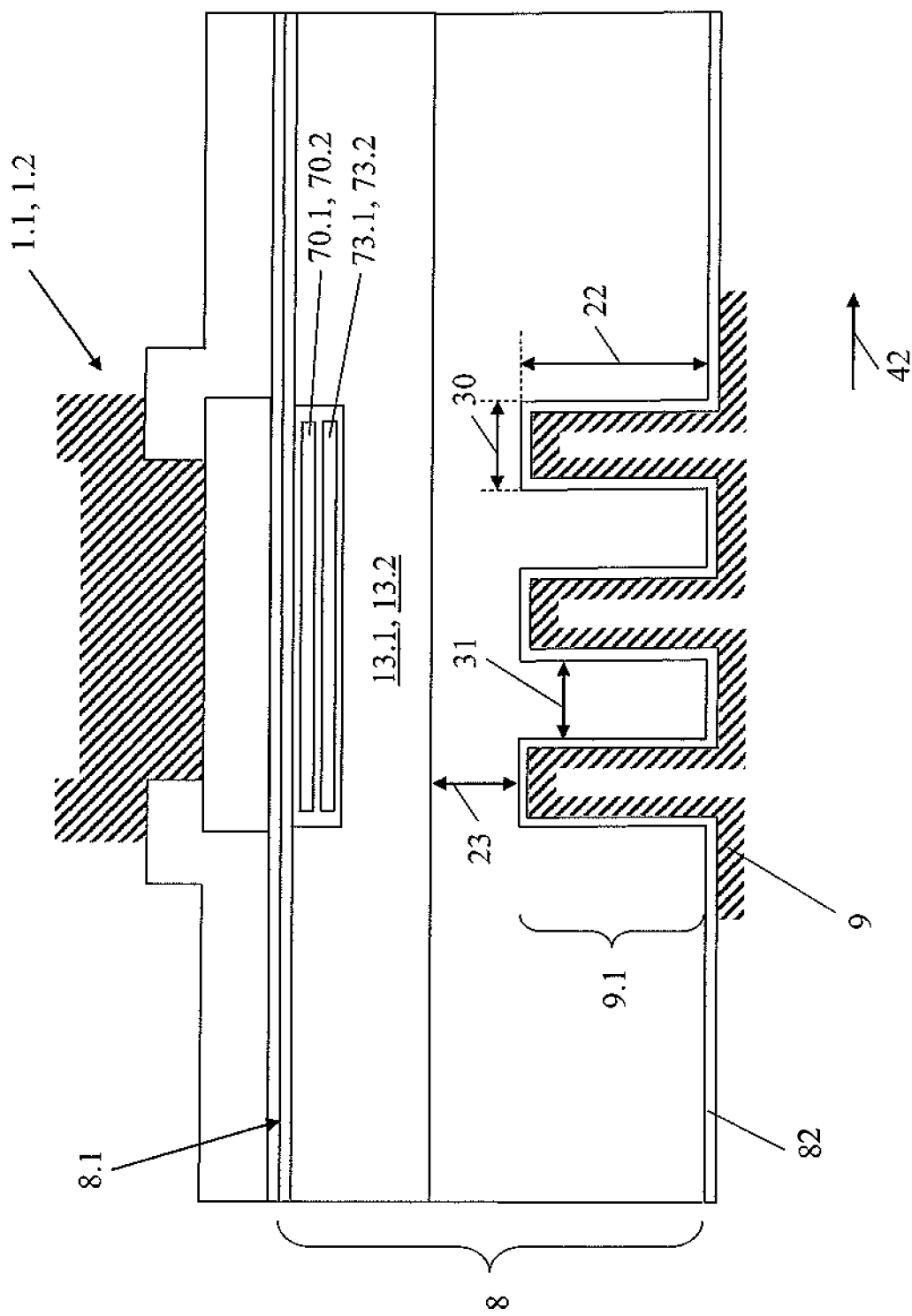

FIGS. 6A-D illustrate some manufacturing steps for the switch element 10 of FIG. 2B. For etching the trenches 11, a hard mask 80 is deposited on the second side 8.2 of the substrate 8 and structured. The hard mask 8 defines the locations 81 where the trenches 11 are etched (FIG. 6A). After the trench etch, it is removed, and a seed layer 82 is deposited (FIG. 6B), for instance by sputtering. For forming a conductive element 9 covering the second side 8.2 only partly, a photoresist mask 83 is deposited and structured. The photoresist mask 83 defines the location for the metal deposition in the subsequent plating process (FIG. 6C), for instance copper plating. Subsequently, the photoresist mask 83 is removed, leaving the conductive element 9 formed in the plating process (FIG. 6D). The part of the seed layer 82 aside the conductive element 9 can be removed in a brief etch step.

Figure 7A:
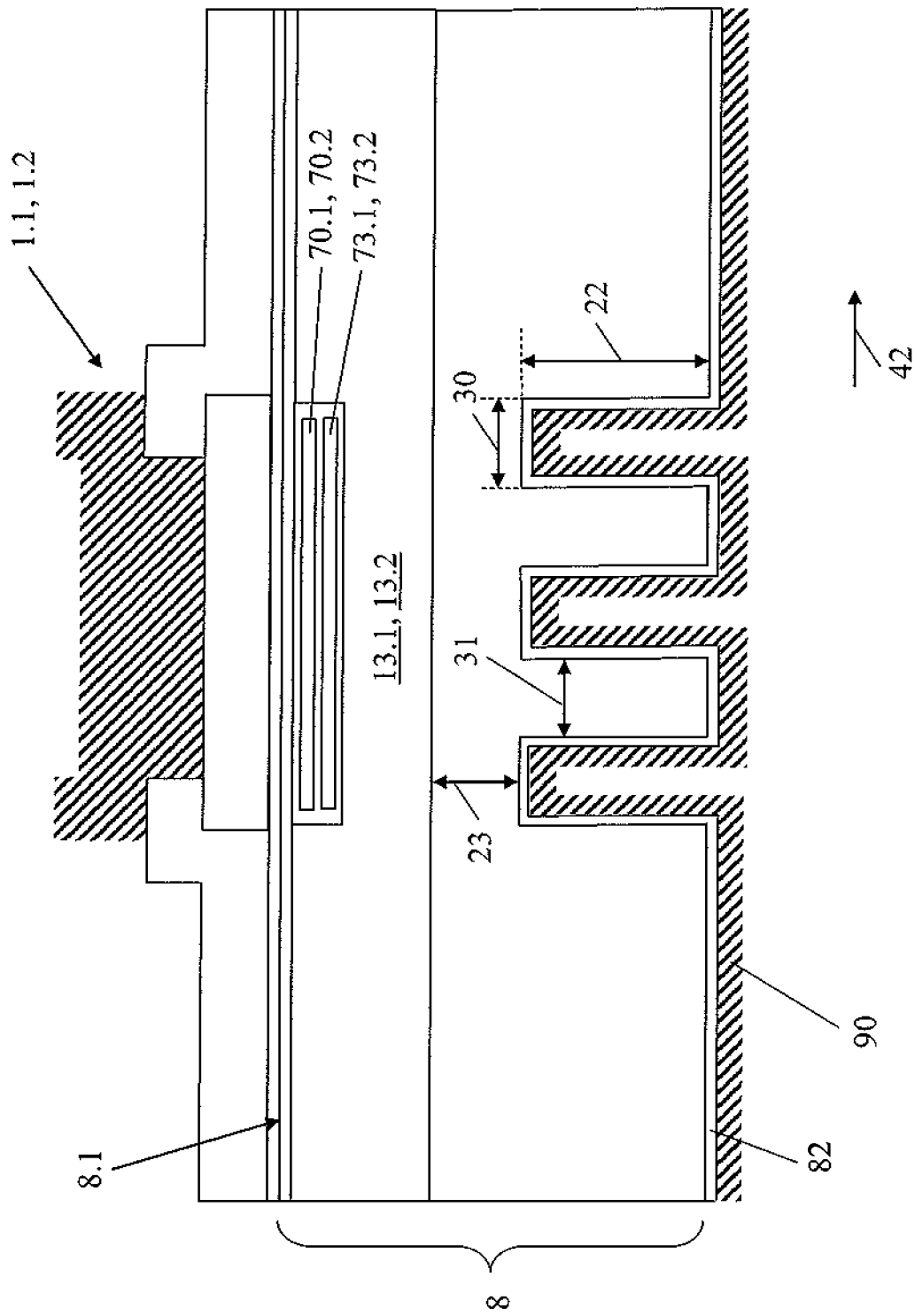
FIGS. 7A-7D illustrate the manufacturing of the switch element of FIG. 3.
Figure 7B:
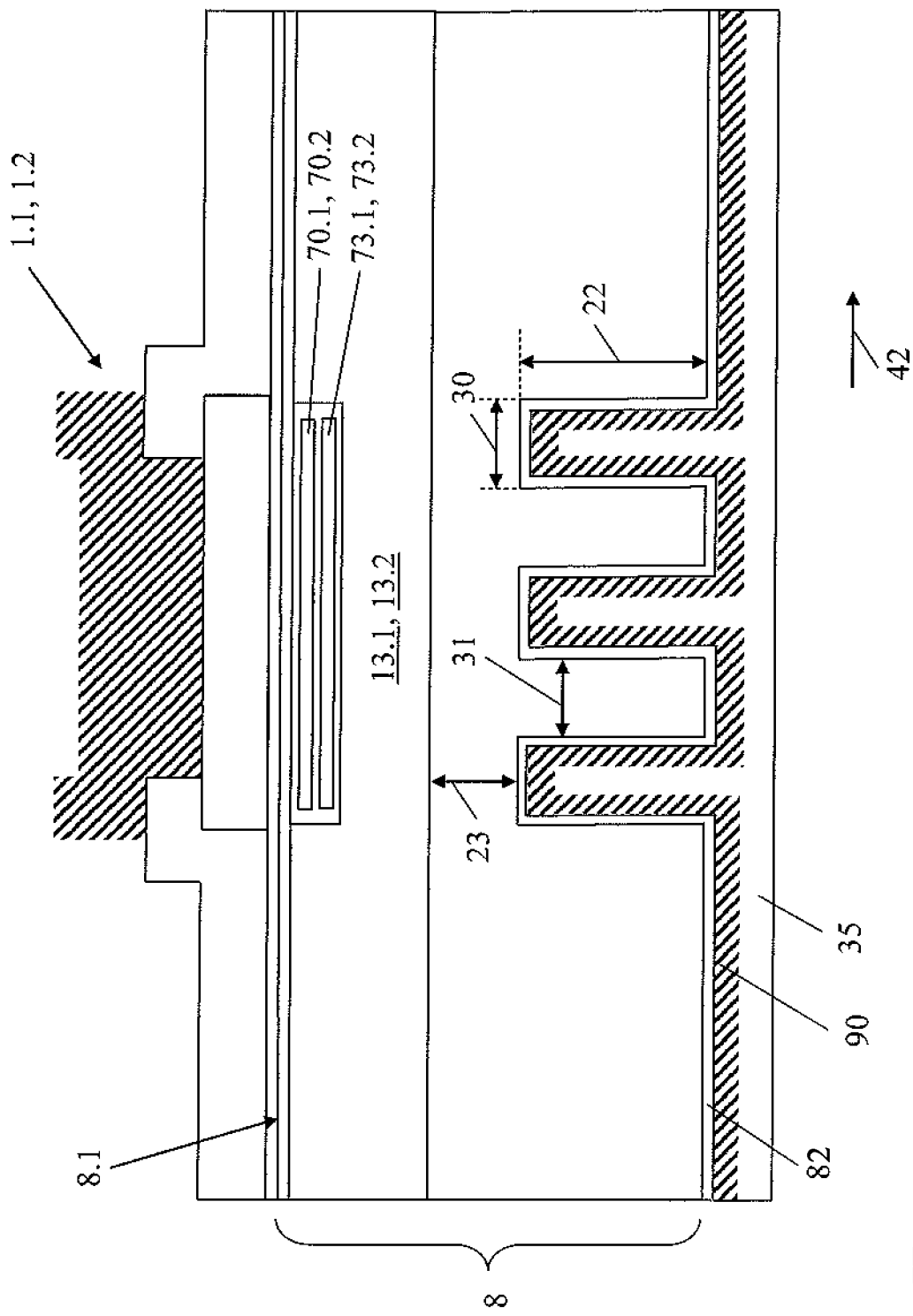
Figure 7C:
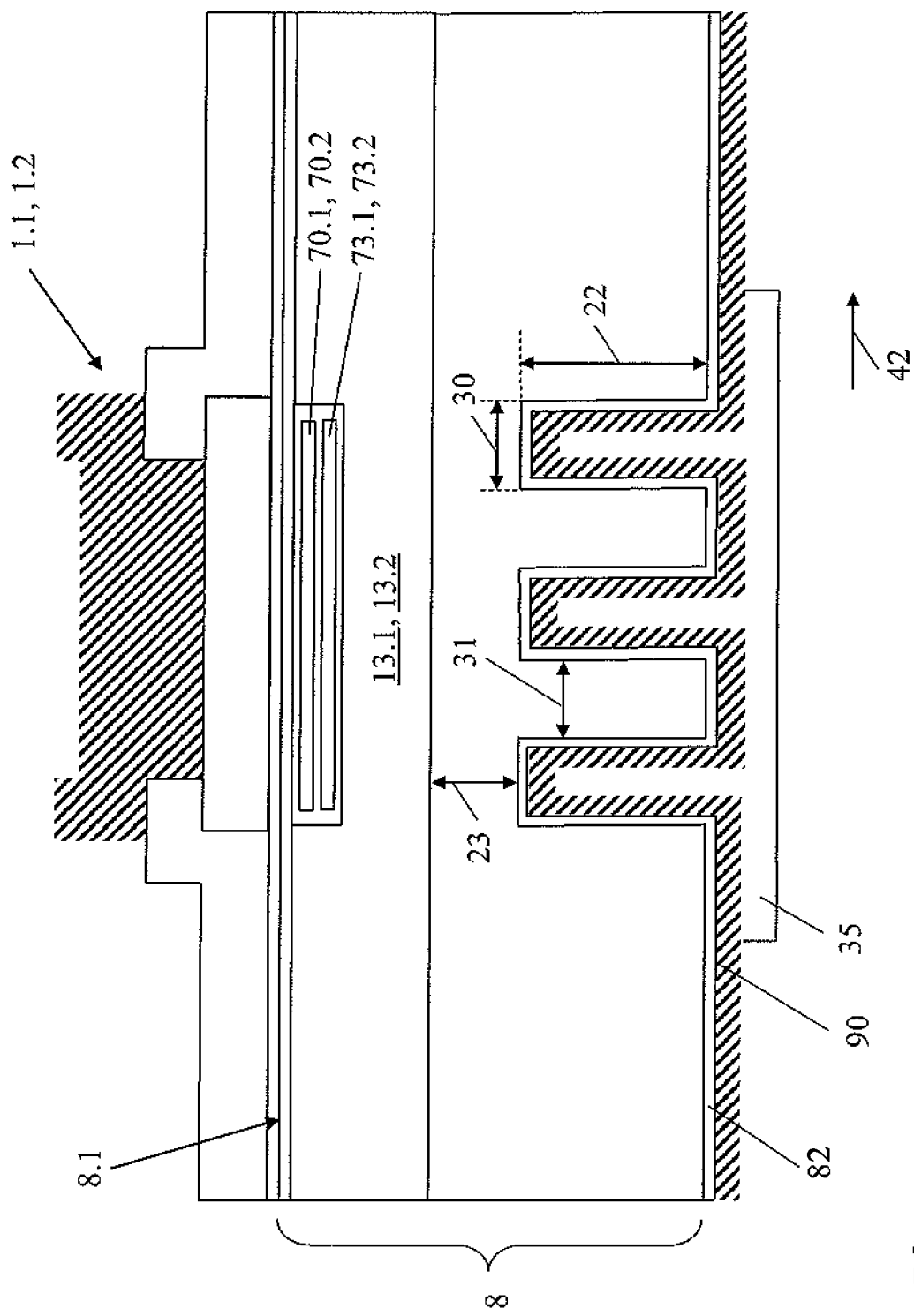
Figure 7D:
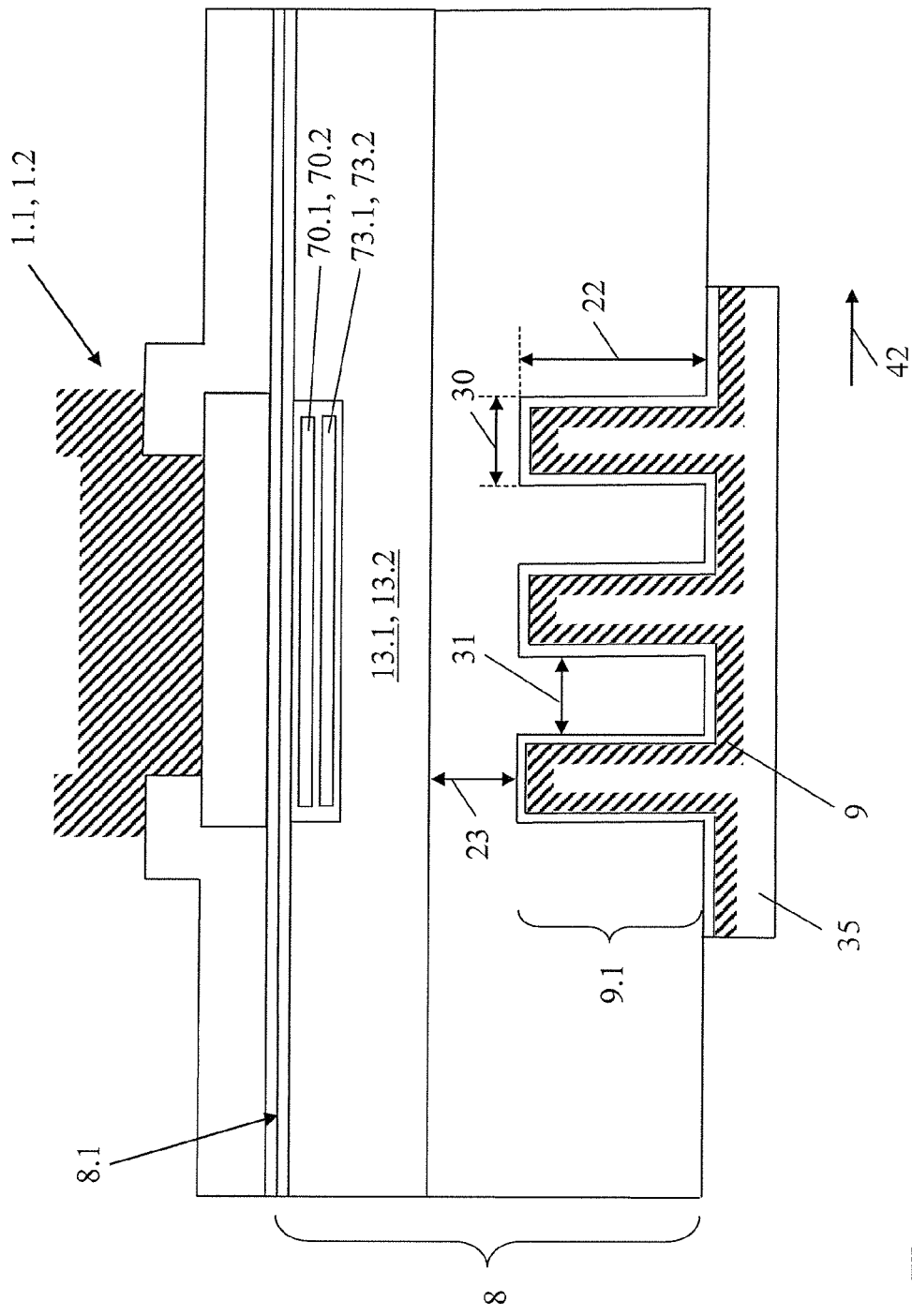

FIGS. 7A-D illustrate some manufacturing steps for the switch element 10 of FIG. 3. In contrast to FIGS. 6A-D, the metal plating is applied without a photoresist mask, the conductive material 90 covers the entire second side 8.2 of the substrate 8 (FIG. 7A). Thereafter, the polymeric material 35 is deposited, filling the remaining holes in the trenches 11 (FIG. 7B). The polymeric material 35 is structured (FIG. 7C) and used as a mask for the removal of the conductive material 90 arranged laterally at the side (FIG. 7D). In this example, the polymeric material 35 remains in the trenches 11. Alternatively, the switch element 10 of FIG. 2B could be obtained by removing the polymeric material 35 subsequently. Moreover, for manufacturing the switch element 10 of FIG. 2B, a photoresist could be used in the steps of FIGS. 7A-D instead of the polymeric material.

Figure 8:
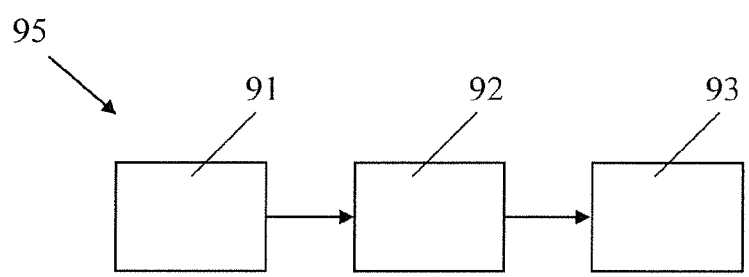
FIG. 8 illustrates some manufacturing steps in a flow diagram.

FIG. 8 illustrates some manufacturing steps in a flow diagram 95. After forming 91 the transistor devices 1.1, 1.2, the trench 11 is etched 92 into the substrate 8. Thereafter, the trench 11 is filled 93 at least partly with the conductive material to form the conductive element 9.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor switch element, comprising:
a first vertical transistor device formed in a substrate and having a source region formed on a first side of the substrate and a drain region formed on a second side of the substrate vertically opposite to the first side;
a second vertical transistor device formed laterally aside the first vertical transistor device in the same substrate and having a source region formed on the first side of the substrate and a drain region formed on the second side of the substrate;
a conductive element arranged on the second side of the substrate and electrically connecting the drain regions of the first and the second vertical transistor device; and
a trench extending vertically into the substrate at the second side of the substrate,
wherein at least a part of the conductive element is arranged in the trench,
wherein the conductive element is formed of a conductive material that fills only a portion of the trench,
wherein another portion of the trench is filled with a polymeric material.

2. The semiconductor switch element of claim 1, wherein the trench has a vertical depth in a range of 15 µm to 40 µm.

3. The semiconductor switch element of claim 1, wherein a vertical distance between a bottom of the trench and a respective drift region of the respective transistor device is at most 30 µm.

4. The semiconductor switch element of claim 1, wherein the trench has a lateral width of at most 100 µm.

5. The semiconductor switch element of claim 1, wherein a plurality trenches extend vertically into the substrate at the second side of the substrate, and wherein at least a part of the conductive element is arranged in each trench of the plurality trenches.

6. The semiconductor switch element of claim 5, wherein the first and the second vertical transistor device are arranged laterally aside each other in a first lateral direction, and wherein at least some of the trenches are arranged laterally aside each other in a second lateral direction perpendicular to the first lateral direction.

7. The semiconductor switch element of claim 5, wherein the trenches are hole-shaped trenches, wherein a first subset of the hole-shaped trenches is arranged vertically aligned with the first transistor device, and wherein a second subset of the hole-shaped trenches is arranged vertically aligned with the second transistor device.

8. The semiconductor switch element of claim 5, wherein the trenches are hole-shaped trenches arranged in rows, and wherein the hole-shaped trenches of neighboring rows are arranged with an offset to each other.

9. The semiconductor switch element of claim 5, wherein the trenches are hole-shaped trenches having a circular cross-section in a lateral plane.

10. The semiconductor switch element of claim 5, wherein the trenches are longitudinal trenches which extend laterally from the first vertical transistor device to the second vertical transistor device.

11. The semiconductor switch element of claim 1, wherein the trench is a longitudinal trench which extends laterally from the first vertical transistor device to the second vertical transistor device.

12. A switch device, comprising:
the semiconductor switch element of claim 1; and
a board on which the semiconductor switch element is mounted,
wherein the semiconductor switch element is mounted on the board by flip chip bonding, with the first side of the substrate facing the board.

13. The switch device of claim 12, wherein the trench of the semiconductor switch element has a vertical depth in a range of 15 µm to 40 µm.

14. A method for manufacturing a semiconductor switch element, the method comprising:
forming a first vertical transistor device in a substrate and having a source region formed on a first side of the substrate and a drain region formed on a second side of the substrate vertically opposite to the first side;
forming a second vertical transistor device laterally aside the first vertical transistor device in the same substrate and having a source region formed on the first side of the substrate and a drain region formed on the second side of the substrate;
etching a trench that extends vertically into the substrate at the second side of the substrate;
filling the trench at least partly with a conductive material to form arranging a conductive element on the second side of the substrate, wherein the conductive element electrically connects the drain regions of the first and the second vertical transistor device, wherein the conductive element is formed of a conductive material that fills only a portion of the trench; and
filling another portion of the trench with a polymeric material.

15. A method of operating a battery management system, the method comprising:
providing a semiconductor switch element that comprises: a first vertical transistor device formed in a substrate and having a source region formed on a first side of the substrate and a drain region formed on a second side of the substrate vertically opposite to the first side; a second vertical transistor device formed laterally aside the first vertical transistor device in the same substrate and having a source region formed on the first side of the substrate and a drain region formed on the second side of the substrate; a conductive element arranged on the second side of the substrate and electrically connecting the drain regions of the first and the second vertical transistor device; and a trench extending vertically into the substrate at the second side of the substrate, wherein at least a part of the conductive element is arranged in the trench, wherein the conductive element is formed of a conductive material that fills only a portion of the trench, wherein another portion of the trench is filled with a polymeric material; and
connecting and disconnecting a battery, via the semiconductor switch element, to a charge and/or discharge path.

* * * * *

UNITED STATES PATENT AND TRADEMARK OFFICE
CERTIFICATE OF CORRECTION

| | | |
|---|---|---|
| PATENT NO. | : 11,581,369 B2 | Page 1 of 1 |
| APPLICATION NO. | : 17/117576 | |
| DATED | : February 14, 2023 | |
| INVENTOR(S) | : S. Leomant et al. | |

It is certified that error appears in the above-identified patent and that said Letters Patent is hereby corrected as shown below:

In the Claims

Column 8, Line 41 Claim 5, change "plurality trenches" to -- plurality of trenches --

Column 8, Line 44 Claim 5, change "plurality trenches." to -- plurality of trenches. --

Signed and Sealed this
Twenty-eighth Day of March, 2023

*Katherine Kelly Vidal*

Katherine Kelly Vidal
*Director of the United States Patent and Trademark Office*